United States Patent [19]
Coutts

[11] Patent Number: 6,030,880
[45] Date of Patent: Feb. 29, 2000

[54] ALIGNMENT FEATURE THAT AVOIDS COMET TAIL FORMATION IN SPIN-ON MATERIALS AND PRODUCTION METHOD THEREFOR

[75] Inventor: Walter A. Coutts, San Antonio, Tex.

[73] Assignees: Sony Corporation of Japan, Tokyo, Japan; Sony Electronics, Inc., Park Ridge, N.J.

[21] Appl. No.: 09/055,015

[22] Filed: Apr. 3, 1998

[51] Int. Cl.$^7$ ..................................................... H01L 21/76
[52] U.S. Cl. .......................... 438/401; 438/462; 438/975; 257/797
[58] Field of Search ..................................... 438/401, 462, 438/703, 593, 975; 257/757, 797, 798

[56] References Cited

U.S. PATENT DOCUMENTS 5,266,511  11/1993  Takao ........................................ 438/401
5,468,664  11/1995  Kajita ........................................ 438/703

*Primary Examiner*—Charles Bowers
*Assistant Examiner*—Craig Thompson
*Attorney, Agent, or Firm*—Wagner, Murabito & Hao LLP

[57] ABSTRACT

An alignment feature that avoids comet tail formation in spin-on materials and production method therefor. In one embodiment, the present invention alignment feature that comprises a trench is anisotropically etched into a surface of a substrate layer. The alignment feature exhibits a cross-sectional profile with sidewalls that are oriented substantially orthogonal to the surface of the substrate layer. Importantly, the present invention alignment feature does not have protruding structures disposed proximate to an intersection of the sidewalls and the surface of the substrate layer. The profile of the present invention alignment feature, with the absence of protruding structures as described above, averts the formation of comet tails in subsequently deposited spin-on materials. Thus, the present invention provides an alignment feature that completely avoids the deleterious effects of comet tails in spin-on materials without having to waste voluminous amounts of expensive spin-on materials. The present invention also lowers the overall costs and improves the yield and the throughput of manufacturing processes used in the art without requiring significant expenditure in acquiring new equipment or retrofitting existing equipment.

20 Claims, 7 Drawing Sheets

6,030,880

ALIGNMENT FEATURE THAT AVOIDS COMET TAIL FORMATION IN SPIN-ON MATERIALS AND PRODUCTION METHOD THEREFOR

TECHNICAL FIELD

The present claimed invention relates to the field of semiconductor device fabrication and micromachining. More specifically, the present claimed invention relates to the efficacy of spin-on material deposition in semiconductor and micromachine manufacturing processes.

BACKGROUND ART

During conventional semiconductor manufacturing processes, numerous coatings are applied to and removed from semiconductor wafers. One of the processes used is lithography, which defines photographically the surface geometry of the various integrated-circuit (IC) components on the wafer. Lithography starts with applying a layer of photoresist over the semiconductor wafer, followed by stepping. During stepping, the deposited photoresist is selectively exposed to light according to a predetermined layout disposed on a mask. The exposed photoresist is rendered soluble (in the case of positive photoresist) and is subsequently removed using a chemical developer, leaving the mask pattern on the wafer. The semiconductor wafer then undergoes etching with the remaining photoresist protecting the unexposed areas of the wafer from the etchant. Thus, the substrate layer of the wafer directly underneath the photoresist layer is etched in accordance with the mask pattern. The semiconductor wafer is generally subjected to multiple iterations of these and other processes before all IC components are fully fabricated on the wafer.

With reference to Prior Art FIG. 1, a top view of semiconductor wafer 5 is shown. A semiconductor wafer 5 is generally divided into numerous identical regions 12 called dies or exposure shots. Each die 12 will be photographically exposed according to a mask pattern after photoresist has been applied to the wafer 5 as described above. Thus, when the fabrication process is completed, each die 12 will contain the complete circuitry of an IC chip. These dies 12 are delineated on the semiconductor wafer 5 by scribe lines or scribe alleys 15. Generally, scribe alleys 15 are disposed on the upwardly-facing surface of the semiconductor wafer 5 in two mutually perpendicular directions, namely, the x-direction and the y-direction, thus dividing the wafer 5 into multiple square or rectangular dies 12. It is crucial that the array of dies 12 on the semiconductor wafer 5 in Prior Art FIG. 1 and the corresponding masks line up exactly during every lithography step so that the different mask patterns can be accurately superimposed on the wafer 5. To enable accurate positioning of the wafer 5 relative to a mask within a wafer stepper, alignment features, not shown in Prior Art FIG. 1, are disposed along the scribe alleys 15 of the wafer 5.

Prior Art FIG. 2 is a top view of an intersection of two scribe alleys 15 disposed perpendicular to each other with an alignment feature 10 disposed on the bottom surface of one of the two scribe alleys 15. Four neighboring dies 12 are also partially shown. An alignment feature 10 is a small trench created by performing an etch into the bottom surface of the scribe alley 15. Using several alignment features 10 on the semiconductor wafer as position markers, a wafer stepper can accurately position the wafer during various fabrication steps.

Once the alignment features 10 have been created in the scribe alleys 15 of a wafer 5, the wafer 5 is subjected to additional processing steps. In particular, to perform a lithography step, photoresist has to be first applied over the upwardly-facing surface of the wafer 5 before photographic exposure, as described above. Commonly, a desired amount of photoresist is centrally dispensed onto the upwardly-facing surface of the semiconductor wafer 5. Rotational motion of the wafer 5 causes the photoresist to spread radially outward from the center portion of the semiconductor wafer 5 towards the edge of the semiconductor wafer 5 such that the entire upwardly-facing surface of the wafer 5 is coated with a layer of photoresist.

However, it has long been recognized in the semiconductor processing art that the presence of alignment features result in the formation of comet tails during subsequent spin-on deposition of photoresist on the surface of a wafer. Referring now to Prior Art FIG. 3, a top view of a prior art alignment feature 10 disposed on the bottom surface of a scribe alley 15 is shown. In Prior Art FIG. 3, photoresist has been applied to the upwardly-facing surface of the wafer by a spin-on process as described above, and a comet tail 35 originating from the alignment feature 10 and parts of four neighboring dies 12 are also shown. A comet tail 35 is an area of the upwardly-facing surface of the wafer which is not covered or which is not as thickly covered by photoresist after the spin-on process. In other words, the spin-on process does not adequately coat the complete surface of the wafer with photoresist. Instead, the spin-on process leaves various "bald" areas with little or no photoresist. These bald areas originate from various prior art alignment features 10 and are shaped like the tail of a comet on the wafer surface. Although the above description specifically recites problems associated with comet tail formation in photoresist spin-on processes, it will be understood that comet tail formation is a problem associated with numerous other spin-on processes. That is, the problem of comet tail formation is not limited solely to photoresist spin-on processes.

Referring next to Prior Art FIG. 4, a top view of a wafer with multiple comet tails 35 originating from several prior art alignment features 10 disposed along scribe alleys 15 is shown. Since the areas on the wafer affected by the comet tails 35 are not coated by photoresist, these areas will not be able to capture proper photographic exposure during stepping. Hence, the desired mask pattern cannot be developed in the affected areas. Any die 12 that is affected by a comet tail 35 will consequently yield a defective die. As is illustrated in Prior Art FIG. 4, a total of 15 dies are affected by the three comet tails 35 shown. Even though it has long been perceived by persons skilled in the semiconductor processing art that the formation of comet tails 35 is induced by prior art alignment features 10, no satisfactory solution has been developed to avoid the formation of comet tails 35 caused by prior art alignment features 10. As such, prior art alignment features 10 adversely affect the yield of semiconductor manufacturing processes by inducing comet tail formation in spin-on processes, thereby resulting in the production of defective dies.

Next, the formation of prior art alignment features and the physical characteristics of these alignment features are further described. As one of numerous steps in the semiconductor fabrication process, etching of alignment features is usually preceded by another processing step. Frequently, a separate etching step, such as one for the removal of an oxide layer, is performed prior to the etching of alignment features. More particularly, either of two common etching techniques, wet etching and dry etching, can be selected in the design of process flow within the fabrication process (process integration). Wet etching involves immersing a batch of lithographically treated wafers in a liquid chemical etchant, such as hydrochloric acid (HCl) or potassium hydroxide (KOH), so that the areas of the wafers not masked by photoresist are etched away by the etchant while the masked areas are shielded from the chemical reaction. In contrast, dry etching, also known as plasma etching, typically involves bombarding photoresist-covered wafers, one wafer at a time, with an accelerated beam of reactive ions so that the uncovered areas of the wafer is etched away, as is the case in reactive ion etching (RIE). Due to the batch processing of wafers in wet etching versus the sequential treatment of individual wafers in dry etching, wet etching is generally perceived to be more cost effective than dry etching and is thus commonly selected over dry etching in process integration.

Unfortunately, areas of a wafer that are formed by wet etching frequently exhibit a characteristic cross-sectional profile that is non-conducive to the deposition of photoresist over the wafer in subsequent processing steps. Prior Art FIG. 5 more particularly illustrates the characteristic cross-sectional profile of a prior art alignment feature 10 that is formed by wet etching. Prior Art FIG. 5 is a cross-sectional view of a scribe alley 15 on a wafer with an alignment feature 10 disposed on the bottom surface 16 of the scribe alley 15. Two neighboring dies 12 are also shown with scribe alley 15 separating the dies 12. In this instance, the prior art alignment feature 10 has been wet etched into the bottom surface 16 of the scribe alley 15. In particular, wet etching routinely results in the formation of protruding structures 53 and 54, which are disposed at or near the intersection of the alignment feature's sidewalls 51 and 52 and the bottom surface 16 of the scribe alley 15, and recessed or hollow areas 55 and 56 directly underneath protruding structures 53 and 54, as shown in Prior Art FIG. 5.

Alternatively, in the formation of an alignment feature, a wet etching step is followed by a dry etching step. Prior Art FIG. 6 shows a cross-sectional view of an alignment feature 10 etched into the bottom surface 16 of a scribe alley 15 by a combination of wet etching and dry etching, with two dies 12 on opposite sides of the scribe alley 15. In Prior Art FIG. 6, alignment feature 10 has sidewalls 61 and 62, each of which comprises two distinct and corresponding segments. Specifically, sidewall 61 exhibits an upper segment 61a formed by wet etching and a lower segment 61b formed by dry etching. As explained above with respect to Prior Art FIG. 5, the peculiar profile of upper portion 61a with protruding structure 63 and recessed area 65 is attributable to the characteristic etching action of wet etching. On the other hand, the relatively straight lower segment 61b is a typical result of dry etching action. Likewise, for the same reasons, sidewall 62 has an upper segment 62a and a lower segment 62b that correspond, respectively, to upper segment 61a and lower segment 61b of sidewall 61, with upper segment 62a further comprising protruding structure 64 and recessed area 66. Thus, the combination of a first wet etching step and a subsequent dry etching step leads to the formation of alignment feature 10 as depicted in Prior Art FIG. 6.

Prior art photoresist spin-on processes have attempted to alleviate the deleterious effects of comet tails by dispensing excessive amounts of photoresist on the semiconductor wafer during the spin-on application of photoresist. Simply stated, in these prior art spin-on processes, additional photoresist is dispensed until the comet tails that are initially formed by a first wave of outwardly-spreading photoresist are finally filled up by subsequent waves of outwardly-spreading photoresist. In other words, a huge excess of photoresist is dispensed to cover up the comet tails caused by prior art alignment features. As an example, in a typical prior art spin-on process, 5 or more milliliters (ml) of photoresist is dispensed for coating each wafer such that all comet tails are covered up. However, a large proportion (approximately 98%) of the dispensed photoresist is spun off rather than remaining on the wafer for photographic exposure. Thus, dispensing such a voluminous amount of expensive photoresist in these prior art spin-on processes inevitably results in a substantial waste of photoresist and higher manufacturing costs for the overall fabrication process.

Thus, a need exists for an alignment feature and a production method which do not result in the formation of deleterious comet tails during subsequent processing steps. A further need exists for an alignment feature and a production method which eliminate the necessity to waste expensive spin-on material. Still another need exists for an alignment feature and a production method which meet the above needs without incurring substantial capital expenditures for new processing equipment or extensive retrofitting of current processing equipment.

DISCLOSURE OF THE INVENTION

It is, therefore, an object of the present invention to provide an alignment feature and a production method which do not induce the formation of deleterious comet tails during subsequent processing steps. Another object of the present invention is to provide an alignment feature and a production method which eliminate the necessity to waste expensive spin-on material. Yet another object of the present invention is to provide an alignment feature and a production method which meet the above needs without incurring substantial capital expenditures for new processing equipment or extensive retrofitting of current processing equipment. The above objects have been achieved with an alignment feature which does not have protruding structures disposed proximate to an intersection of the alignment feature's sidewall and the surface of a substrate layer. The present invention also provides a production method for this novel alignment feature.

Specifically, in one embodiment, an alignment feature that avoids comet tail formation in spin-on materials and a production method therefor are provided. In this embodiment, the present invention comprises a trench which is anisotropically etched into a surface of a substrate layer. The alignment feature exhibits a cross-sectional profile with sidewalls that are oriented substantially orthogonal to the surface of the substrate layer. Importantly, the alignment feature of the present invention does not have protruding structures disposed proximate to an intersection of the sidewalls and the surface of the substrate layer. The profile of the present invention alignment feature, with the absence of protruding structures as described above, averts the formation of comet tails in subsequent processing steps. Thus, the present invention provides an alignment feature that completely avoids the deleterious formation of comet tails in spin-on materials without having to waste voluminous amounts of expensive spin-on materials. The present invention also lowers the overall costs and improves the yield and the throughput of manufacturing processes used in the art without requiring significant expenditure in acquiring new equipment or retrofitting existing equipment.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

Prior Art

Prior Art

Prior Art

Prior Art

Prior Art

Prior Art

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. To the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
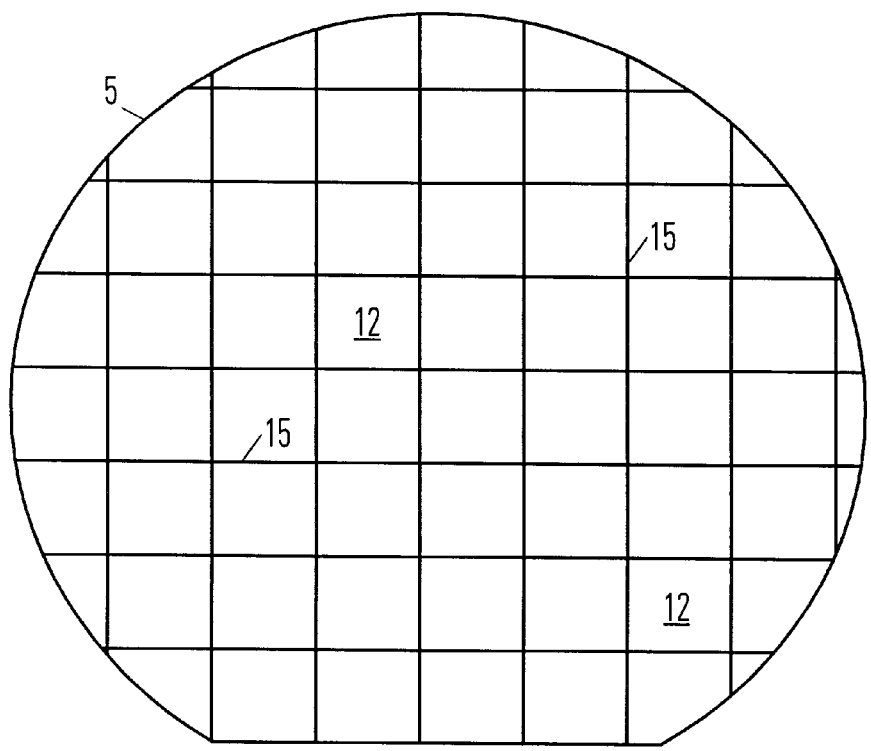
FIG. 1 is a top view of a semiconductor wafer with scribe alleys disposed on the upwardly-facing surface of the wafer.
Figure 2:
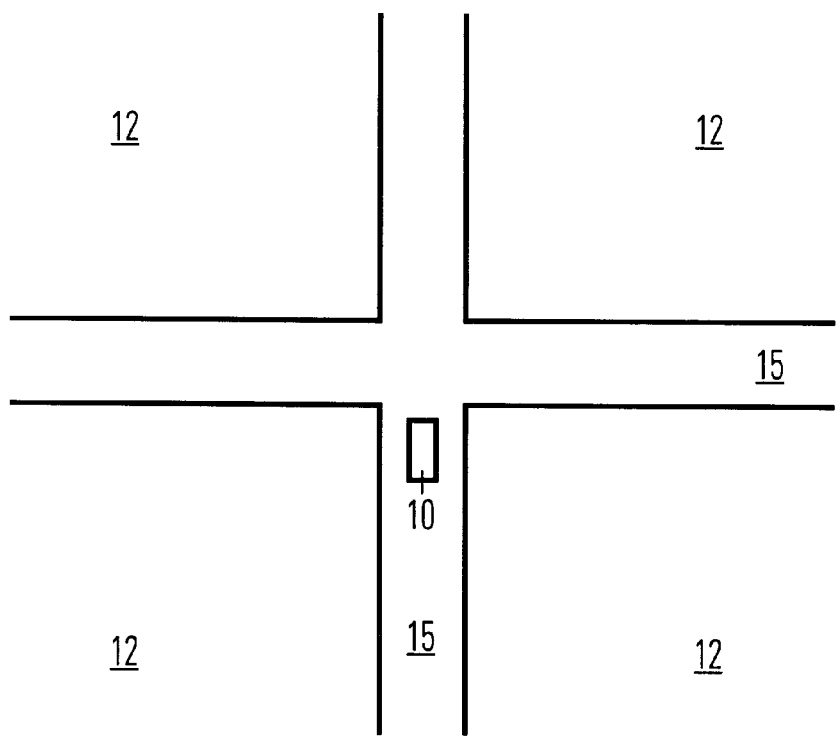
FIG. 2 is a top view of an intersection of two scribe alleys disposed perpendicular to each other with an alignment feature disposed on the bottom surface of one of the two scribe alleys.
Figure 3:
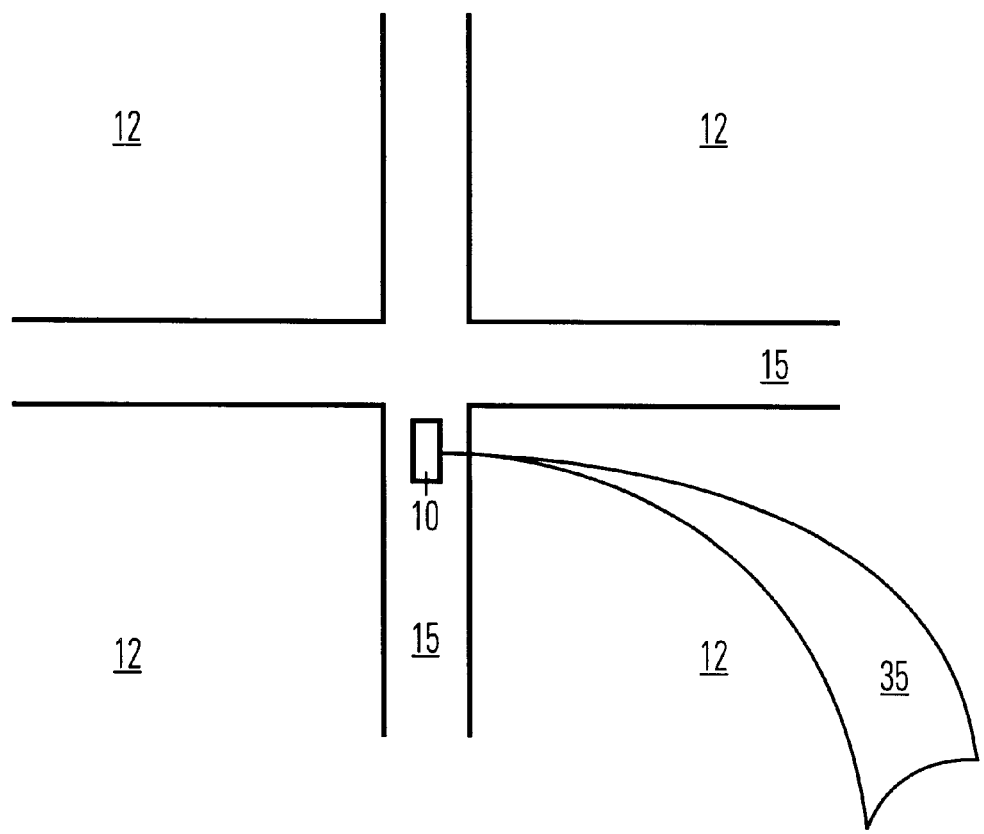
FIG. 3 is a top view of an intersection of two scribe alleys disposed perpendicular to each other with a prior art alignment feature disposed on the bottom surface of one of the two scribe alleys, and a comet tail is shown originating from the alignment feature.
Figure 4:
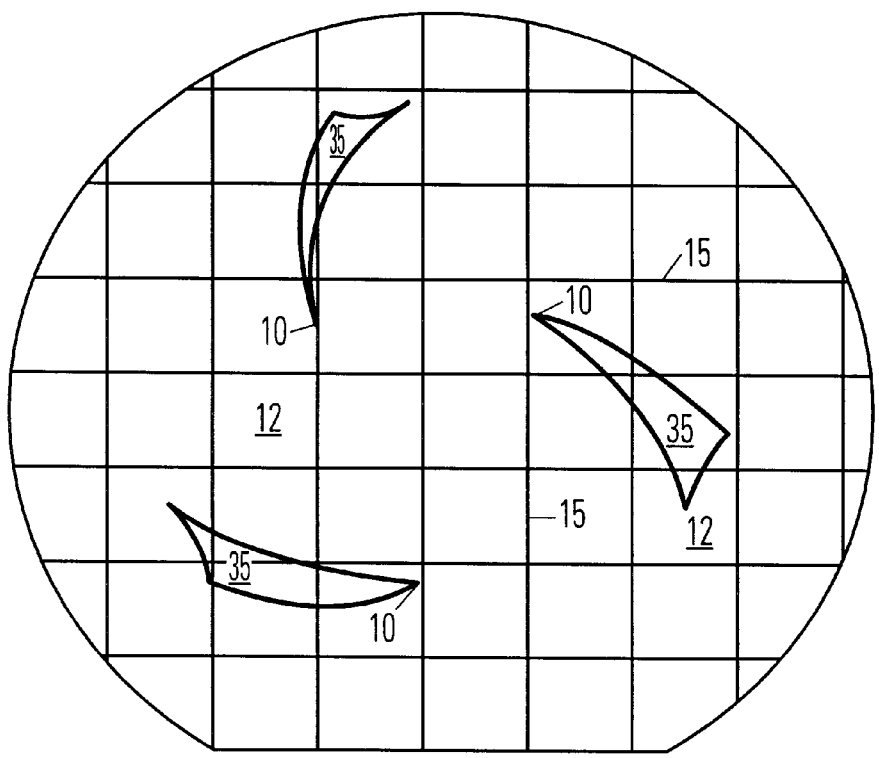
FIG. 4 is a top view of a semiconductor wafer with prior art alignment features disposed on the bottom surface of the scribe alleys after spin-on application of photoresist, with comet tails originating from a number of alignment features.
Figure 5:
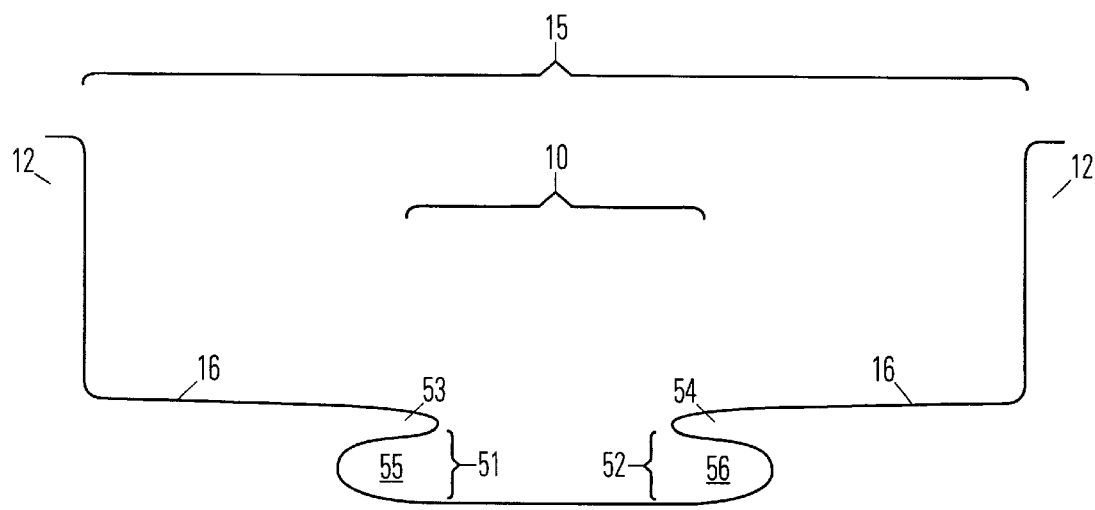
FIG. 5 is a cross-sectional view of a scribe alley through a prior art alignment feature that is wet-etched into the bottom surface of the scribe alley.
Figure 6:
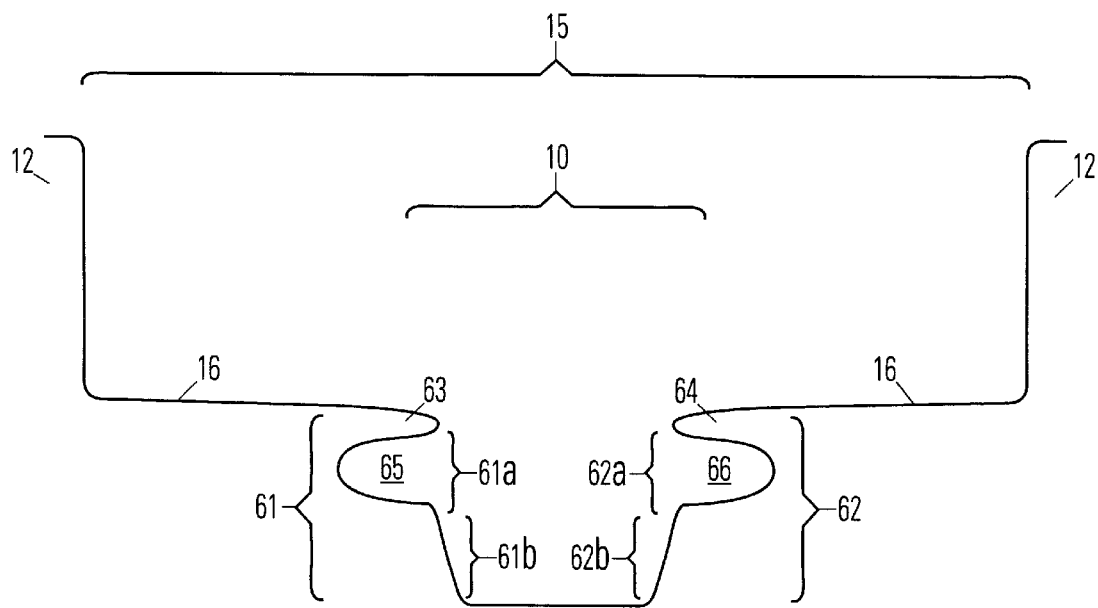
FIG. 6 is a cross-sectional view of a scribe alley through a prior art alignment feature, which is formed by a combination of a wet etching first step and a dry etching second step, into the bottom surface of the scribe alley.
Figure 7:
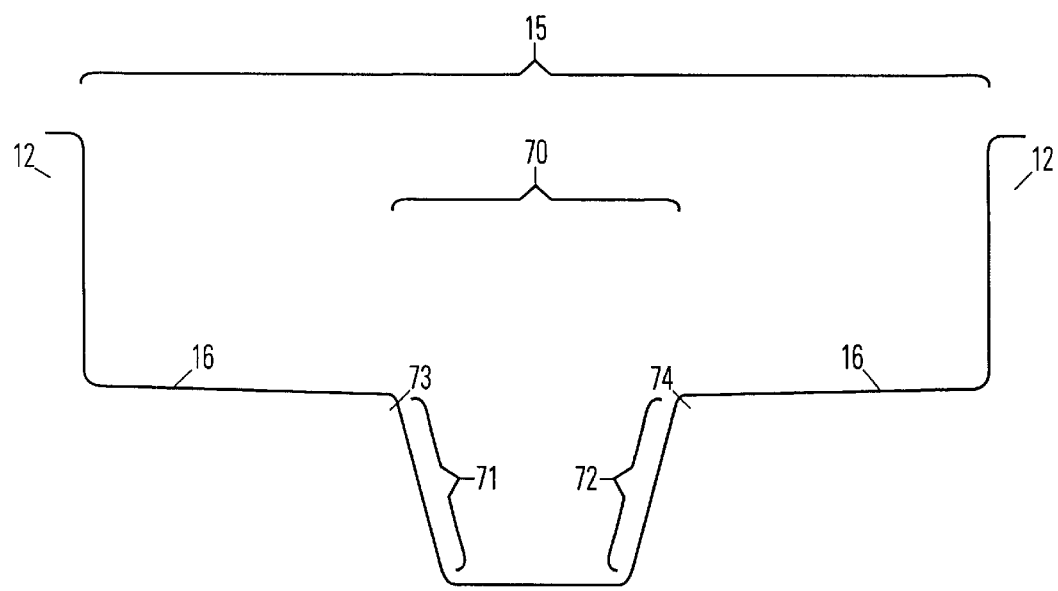
FIG. 7 is a cross-sectional view of a scribe alley through an alignment feature that is anisotropically etched into the bottom surface of the scribe alley in accordance with the present claimed invention.

As illustrated in FIG. 7, the present invention provides an alignment feature 70 that does not have protruding structures as found in the prior art. In particular, no protruding structure is disposed at or near the intersections 73 and 74 of the bottom surface 16 of scribe alley 15 and the sidewalls 71 and 72 of the alignment feature 70. As shown in FIG. 7, the absence of protruding structures in the instant alignment feature 70 also means that there is no recessed areas that are found in the prior art alignment features 10. Moreover, the sidewalls 71 and 72 are oriented substantially orthogonal to the surface 16 of the scribe alley 15, as depicted in FIG. 7. By eliminating the protruding structures, which are prevalent in prior art alignment features and which cause the formation of comet tails, the present invention eradicates the undesirable formation of comet tails in spin-on photoresist deposited subsequently. In so doing, the neighboring dies 12 and other adjacent dies will not be rendered defective in subsequent processing steps due to the adverse effects associated with comet tails, as is explained above with respect to the prior art alignment features. Consequently, the yield of the manufacturing processes involved will also be significantly improved due to the reduction in the number of defective dies produced.

To form an alignment feature 70 in a scribe alley 15, one embodiment of the present invention first identifies a location on the bottom surface 16 of the scribe alley 15 where the alignment feature 70 is to be created. As is well known in the art, identifying a location on a semiconductor wafer for processing involves the use of a lithographic process as described above. Once the location of the alignment feature 70 is identified and properly marked by a photoresist mask pattern, the alignment feature 70 is formed into the bottom surface 16 of the scribe alley 15 disposed on an upwardly-facing surface of a semiconductor wafer, as shown in FIG. 7. More specifically, the alignment feature 70 is formed by etching, within an etching environment, a trench into the scribe alley surface 16 such that the trench has a cross-sectional profile without protruding structures as described in detail above. In this embodiment, the alignment feature 70 of the present invention is disposed along a scribe alley 15 that is approximately 80 microns (um) wide. In other words, the distance between two adjacent dies 12 is approximately 80 microns.

In this embodiment, the alignment feature 70 can have a width ranging approximately from 4 microns to 10 microns. Moreover, depending on the particular application, the alignment feature 70 can have a depth approximately between 800 and 2000 angstroms (A) into the bottom surface 16 of the scribe alley 15. Frequently, the type and settings of the processing equipment in which the wafer is processed, the thickness of the substrate layer and other parameters determine the width and depth of the alignment feature 70 needed in a particular application. As will be understood by a person skilled in the semiconductor processing art, a variety of etching environments can be used within the present invention, so long as the alignment feature 70 formed does not possess the deleterious cross-sectional profile as in the prior art. In particular, an anisotropic etching environment is well-suited for purposes of the present invention.

It is further appreciated that the deleterious protruding structures and the attendant recessed areas of the prior art alignment features 10 are caused by the isotropic etching action that is characteristic of wet etching. Stated differently, immersion of wafers in a liquid etchant in wet etching results in equal etching action in all directions. As a result, the sidewall of a trench that has been wet etched generally have a cross-sectional profile with a recessed area caused by lateral etching action and a protruding structure immediately above the recessed area, as is the case in prior art alignment features. It is also appreciated that isotropic dry etching will lead to the same result. Hence, the anisotropic etching techniques utilized to create alignment feature 70 of the present invention ensure that the sidewalls of alignment feature 70 do not exhibit the deleterious profile of the prior art alignment feature. The advantageous sidewall profile of alignment feature 70 of the present invention is achieved owing to the preferential etching action of anisotropic (not equal in all directions) in the vertical direction and the absence of lateral etching action. In one embodiment, reactive ion etching (RIE) which is anisotropic in nature is used to create alignment feature 70 of the present invention.

Additionally, by consolidating the creation of alignment feature 70 into a single anisotropic etching step, as opposed to the prior art two-step wet etching and dry etching combination as described above, the present invention not only increases the throughput of the production process by eliminating an extraneous process step, but also reduces the cycle time for the manufacturing process by shortening the time required to process each wafer since no time overhead is incurred in transferring wafers between different processing devices, etc. Moreover, since anisotropic etching devices are generally already available at modern fabrication facilities, the present invention furnishes yet another advantage: no significant expenditure is required either for acquisition of new processing equipment or for extensive retrofit of existing equipment in order to implement the present invention. Thus, formation of comet tails and the deleterious effects can be fully averted in a very cost-efficient manner.

As yet another advantage of the present invention, the alignment feature 70 eliminates the undesirable necessity to waste expensive photoresist as is done in the prior art because in the absence of deleterious protruding structures at the fringe of alignment feature 70, comet tails will no longer be formed during spin-on application of photoresist. Consequently, within one embodiment of the present invention, as little as 2 milliliters (ml) of photoresist is sufficient to adequately cover to entire surface of the wafer, as opposed to 6 or more milliliters of photoresist required in the prior art.

It is appreciated that although the present invention has been described above in terms of an alignment feature for avoiding comet tail formation in spin-on photoresist during semiconductor manufacturing processes, the present invention is well-adapted for use in other spin-on processes both within and outside of the semiconductor manufacturing art. For example, the present invention alignment feature and production method is well-suited for the deposition of spin-on-glass (SOG) in conventional semiconductor manufacturing processes. As another example, the present invention can be beneficially applied in the spin-on deposition of low dielectric materials, such as fluoropolymers, on the surface of a substrate. Yet another exemplary application of the present invention is using the instant alignment feature and production method in the micromachining art, in which various spin-on materials are frequently disposed on a substrate layer. More specifically, the manufacture of microsensors used in automobile airbags involves micromachining processes using a silicon substrate and can thus effectively utilize the present invention. Indeed, it is appreciated that any spin-on process, which typically involves spin-on application of a material having a viscosity approximately equal to or higher than that of water, can advantageously utilize the present invention to avert the formation of comet tails in the respective spin-on material and thus avoid the attendant deleterious effect.

Thus, the present invention provides an alignment feature that completely avoids the deleterious effects of comet tails in spin-on materials. Additionally, unlike the prior art, the production method within the present invention does not have to waste voluminous amounts of expensive spin-on materials. The present invention also lowers the overall costs and improves the yield and the throughput of manufacturing processes used in the art. As yet another advantage, the present invention achieves these objects without requiring significant expenditure in acquiring new equipment or retrofitting existing equipment.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. A method of forming an alignment feature on a semiconductor wafer, wherein said alignment feature prevents formation of comet tails during subsequent processing steps, said method comprising the steps of:

a) identifying a location on a surface of a scribe alley for formation of an alignment feature; and b) forming said alignment feature into said scribe alley surface at said location, such that said alignment feature does not induce formation of comet tails in subsequently deposited spin-on material; wherein step b) further comprises:

i) performing an anisotropic etch into said scribe alley surface to form a trench therein, said trench having sidewalls which are oriented substantially orthogonal to said scribe alley surface, said trench not having protruding structures disposed proximate to an intersection of said sidewalls and said scribe alley surface.

2. The method of forming an alignment feature on a semiconductor wafer as recited in claim 1 wherein step b) further comprises:

forming a plurality of said alignment features within said scribe alley.

3. The method of forming an alignment feature on a semiconductor wafer as recited in claim 1 wherein said spin-on material is photoresist.

4. The method of forming an alignment feature on a semiconductor wafer as recited in claim 1 wherein step i) further comprises:

forming said trench having a depth between approximately 800 and 2000 angstroms (A) into said scribe alley surface.

5. The method of forming an alignment feature on a semiconductor wafer as recited in claim 1 wherein step i) further comprises:

forming said trench with a width of between approximately 4 and 10 microns (pm).

6. An alignment means for properly aligning a wafer within a semiconductor processing device, said alignment means comprising:

a) trench means disposed within a bottom surface of a scribe alley, said trench means having a cross-sectional profile comprised of:

i) sidewalls which are oriented substantially orthogonal to said bottom surface of said scribe alley, said trench means not having protruding structures disposed proximate to an intersection of said sidewalls and said bottom surface of said scribe alley, wherein said alignment means does not induce formation of comet tails in subsequently deposited spin-on material.

7. The alignment means for properly aligning a wafer within a semiconductor processing device as recited in claim 6 wherein said alignment means further comprises:

a plurality of trench means disposed within said bottom surface of said scribe alley.

8. The alignment means for properly aligning a wafer within a semiconductor processing device as recited in claim 6 wherein said trench means is anisotropically etched into said bottom surface of said scribe alley.

9. The alignment means for properly aligning a wafer within a semiconductor processing device as recited in claim 6 wherein said trench means has a depth between approximately 800 and 2000 angstroms (Å) into said bottom surface of said scribe alley.

10. The alignment means for properly aligning a wafer within a semiconductor processing device as recited in claim 6 wherein said trench means has a width between approximately 4 and 10 microns ($\mu$m).

11. The alignment means for properly aligning a wafer within a semiconductor processing device as recited in claim 6 wherein said spin-on material is photoresist.

12. A method of avoiding formation of comet tails during disposal of spin-on material on a semiconductor wafer, said method comprising the steps of:

a) etching, within an etching environment, an alignment feature into a surface of a scribe alley disposed on an upwardly-facing surface of said wafer, said alignment feature for properly aligning said wafer within a semiconductor processing device; wherein step a) further comprises:

i) etching a trench having sidewalls which are oriented substantially orthogonal to said scribe alley surface, said trench not having protruding structures disposed proximate to an intersection of said sidewalls and said scribe alley surface;

b) dispensing said spin-on material on said upwardly-facing surface of said wafer; and c) rotating said wafer for evenly dispersing said spin-on material over said upwardly-facing surface of said wafer, wherein said cross-sectional profile of said alignment feature averts formation of comet tails in said spin-on material.

13. The method of avoiding formation of comet tails during disposal of spin-on material on a semiconductor wafer as recited in claim 12 wherein step a) further comprises:

etching a plurality of said alignment features within said scribe alley.

14. The method of avoiding formation of comet tails during disposal of spin-on material on a semiconductor wafer as recited in claim 12 wherein said etching environment is an anisotropic etching environment.

15. The method of avoiding formation of comet tails during disposal of spin-on material on a semiconductor wafer as recited in claim 12 wherein step i) further comprises:

etching said trench having a depth between approximately 800 and 2000 angstroms (Å) into said scribe alley surface.

16. The method of avoiding formation of comet tails during disposal of spin-on material on a semiconductor wafer as recited in claim 12 wherein step i) further comprises:

etching said trench with a width of between approximately 4 and 10 microns ($\mu$m).

17. The method of avoiding formation of comet tails during disposal of spin-on material on a semiconductor wafer as recited in claim 12 wherein said spin-on material is photoresist.

18. The method of avoiding formation of comet tails during disposal of spin-on material on a semiconductor wafer as recited in claim 17 wherein step b) further comprises:

dispensing an amount approximately equal to or less than 2 milliliters (ml) of said photoresist on said upwardly-facing surface of said wafer.

19. An alignment means for properly aligning a substrate layer within a processing device, said alignment means comprising:

a) trench means disposed within a surface of a substrate layer, said trench means having a cross-sectional profile comprised of:

i) sidewalls which are oriented substantially orthogonal to said surface of said substrate layer, said trench means not having protruding structures disposed proximate to an intersection of said sidewalls and said surface of said substrate layer, wherein said alignment means does not induce formation of comet tails in subsequently deposited spin-on material.

20. The alignment means for properly aligning a substrate layer within a processing device as recited in claim 19 wherein said trench means is anisotropically etched into said surface of said substrate layer.

* * * * *